United States Patent
Börjesson et al.

(10) Patent No.: US 6,606,047 B1
(45) Date of Patent: Aug. 12, 2003

(54) METHODS AND APPARATUS FOR ESTIMATING CLIPPED SAMPLES DURING ANALOG TO DIGITAL CONVERSION

(75) Inventors: Per Ola Börjesson, Morrum (SE); Mikael Isaksson, Luleå (SE); Per Ödling, Luleå (SE); Daniel Bengtsson, Luleå (SE); Gunnar Bahlenberg, Luleå (SE); Magnus Johansson, Luleå (SE); Lennart Olsson, Luleå (SE); Sven Göran Ökvist, Luleå (SE)

(73) Assignee: STMicroelectronics NV, Amsterdam (NL)

( * ) Notice: Subject to any disclaimer, the term of this patent is extended or adjusted under 35 U.S.C. 154(b) by 0 days.

(21) Appl. No.: 09/700,888
(22) PCT Filed: May 11, 1999
(86) PCT No.: PCT/SE99/00789
§ 371 (c)(1), (2), (4) Date: Nov. 20, 2000
(87) PCT Pub. No.: WO99/60704
PCT Pub. Date: Nov. 25, 1999

(30) Foreign Application Priority Data

May 20, 1998 (SE) .............................. 9801816

(51) Int. Cl.⁷ ............................... H03M 1/12
(52) U.S. Cl. .................. 341/155; 341/118; 341/120; 341/132; 341/139; 348/229; 708/207; 708/290; 708/313
(58) Field of Search .................. 341/118, 120, 341/132, 139, 155; 348/229; 708/207, 290, 313

(56) References Cited

U.S. PATENT DOCUMENTS

| | | | | |
|---|---|---|---|---|
| 4,562,456 A | * | 12/1985 | Bolger | 341/118 |
| 4,571,732 A | * | 2/1986 | Pirani et al. | 375/12 |
| 5,661,422 A | | 8/1997 | Tice et al. | |
| 5,831,490 A | | 11/1998 | Sarkka et al. | |
| 5,838,269 A | * | 11/1998 | Xie | 341/118 |

OTHER PUBLICATIONS

International Search Report from PCT/SE 99/00789, filed May 11, 1999.
International Preliminary Examination Report from PCT/SE 99/00789, filed May 11, 1999.

* cited by examiner

*Primary Examiner*—Michael Tokar
*Assistant Examiner*—Linh Van Nguyen
(74) *Attorney, Agent, or Firm*—Wolf, Greenfield & Sacks, P.C.; James H. Morris

(57) ABSTRACT

A circuit, for digitizing an analogue signal includes an analogue to digital converter, a clip processor adapted to estimate a value for clipped digital signal samples, and a buffer adapted to dynamically store a plurality of digitized samples produced by the analogue to digital converter. The clip processor is adapted to read digitized samples from the buffer and replace clipped digitized samples with the estimated values, thereby mitigating the effects of clipping in an output of the circuit.

28 Claims, 7 Drawing Sheets

METHODS AND APPARATUS FOR ESTIMATING CLIPPED SAMPLES DURING ANALOG TO DIGITAL CONVERSION

The present invention relates to analogue to digital converters, methods of analogue to digital conversion, in particular analogue to digital conversion using clip processors adapted to regenerate a clipped signal, produced when an analogue signal exceeds the dynamic range of an analogue to digital converter, and to clip processors for use with analogue to digital converters.

The ability to perform digital signal processing has had, and continues to have, a major impact on todays society. Central, to digital signal processing, is the conversion of analogue signals to a digital format. This process is implemented with an analogue-to-digital converter (ADC), an electronic circuit that takes an analogue signal as input and gives a digital representation of the analogue signal as an output. The process of analogue to digital conversion employs the steps of:

sampling the analogue signal to split the continuous signal up into a set of discrete components along the time axis;

quantising the sampled signals by comparing them to a set of discrete signal values; and digitising the quantised signal to produce a binary word representative of the analogue sample.

ADCs have a limited amplitude, or dynamic, range for which they can produce an accurate digital representation, however quantised, of the input signal. If the input signal exceeds the dynamic range of an ADC, the digital representation will no longer correspond to the analogue input but will only indicate that the analogue signal is outside the dynamic range. This phenomenon is called "clipping". The digital version of an analogue signal, which exceeds the dynamic range of the ADC used to digitise it, is a poor representation of that signal. However, the output of the ADC will give an indication that the dynamic range of the ADC has been exceeded and that signal clipping has occurred.

The present invention uses this information to improve the digital representation of the analogue signal in the sense that the correspondence between the input and output signals is improved.

According to a first aspect of the present invention, there is provided a circuit, including an analogue to digital converter for digitising an analogue signal, characterised in that said circuit includes a clip processor, adapted to estimate a value for clipped digital signal samples and means for replacing said digital signal samples with said estimated values, thereby mitigating the effects of clipping in an output from said circuit.

Said means for replacing may be a buffer adapted to dynamically store a plurality of digitised samples produced by said analogue to digital converter, and said clip processor may be adapted to read digitised samples from said buffer and replace said clipped digitised samples with estimates of unclipped values thereof.

Said analogue to digital converter may be adapted to produce a signal indicative of analogue to digital converter saturation, said clip processor may be adapted to receive said signal, and said clip processor may be adapted, on receipt of said signal, and for so long as said signal is present, to estimate values for clipped digital signal samples and to cause said means for replacing to replace said digitised samples with estimates of unclipped values thereof.

Said clip processor may be adapted to detect saturation of said analogue to digital converter by comparing a digitised sample produced by said analogue to digital converter to maximum and minimum values for said analogue to digital converter's dynamic range.

Said means for replacing may be incorporated within said clip processor.

Said buffer may be a shift register.

Said buffer may be of a length sufficient to store:

a first plurality of unclipped samples occurring before a group of clipped samples;

said group of clipped samples; and a second plurality of unclipped samples following said group of clipped samples.

Said first and second plurality of samples may include identical numbers of samples.

Said first and second pluralities of samples may each comprise three samples.

Said clip processor may be adapted to measure the number of samples in a consecutive group of clipped samples.

Said clip processor may be adapted to estimate a value for each sample in said consecutive group of clipped samples from the number of samples in said group, the values of samples in a consecutive group of samples immediately preceding said consecutive group of clipped samples and the values of samples in a consecutive group of samples immediately following said consecutive group of clipped samples.

A digital signal may have a higher bit resolution after processing by said clip processor than it had prior to processing by said bit processor.

Said clip processor may be adapted to estimate a value for each sample in said consecutive group of clipped samples from:

the number of samples in said group;

the values of samples in a consecutive group of samples immediately preceding said consecutive group of clipped samples;

the values of samples in a consecutive group of samples immediately following said consecutive group of clipped samples;

a normalised clip level, or crest factor; and an autocorrelation factor of a channel over which said analogue signal has been transmitted.

Said clip processor may be adapted to estimate a value for each sample in said consecutive group of clipped samples from:

the number of samples in said group;

the values of samples in a consecutive group of samples immediately preceding said consecutive group of clipped samples;

the values of samples in a consecutive group of samples immediately following said consecutive group of clipped samples;

a normalised clip level, or crest factor; and an autocorrelation factor of said analogue to digital converter.

Said first plurality of samples may include a single sample contiguous with said group of clipped samples and said second plurality of samples may include a single sample contiguous with said group of clipped samples.

Said clip processor may feed $n_{cut}$ (where $n_{cut}$ is the number of samples in a group of clipped samples), coefficient vectors, $a_k$, sequentially, to a vector multiplier which performs one scalar product per clipped sample to be estimated, and said scalar multiplier may be adapted to multiply each sample, from a group of unclipped samples contiguous with a group of clipped samples, with a coefficient vector belonging to a sample to be estimated.

An output from said vector multiplier may be passed through a non-linearity to ensure that estimates of clipped samples stay above a clip level.

According to a second aspect of the present invention, there is provided, a digital receiver, characterised in that said digital receiver includes a circuit, including an analogue to digital converter, for digitising a received analogue signal as set forth in any preceding paragraph.

According to a third aspect of the present invention, there is provided a DMT transmission system, characterised in that said DMT transmission system includes a plurality of receivers as set forth in the preceding paragraph.

According to a fourth aspect of the present invention, there is provided a method of digitising an analogue signal, in which said analogue signal is subjected to the steps of:
  sampling;
  quantisation; and
  digitisation;
characterised by the steps of:
  buffering samples of said digitised signal;
  detecting whether said samples are clipped;
  determining a number of consecutive clipped samples, constituting a group of clipped samples;
  reading a first plurality of unclipped samples preceding said group of clipped samples into a buffer, reading said group of clipped samples into said buffer and reading a second plurality of unclipped samples into said buffer;
  computing an estimate of the unclipped values of said group of clipped samples; and
  overwriting said group of unclipped samples with the estimated values thereof.

According to a fifth aspect of the present invention, there is provided a method of analogue to digital conversion, characterised by estimating values for clipped digital signal samples and replacing said clipped digital signal samples with said estimated values, thereby mitigating the effects of clipping.

A plurality of digitised samples, produced by an analogue to digital converter, may be dynamically stored in a buffer, digitised samples may be read from said buffer into a clip processor and said clipped digitised samples, in said buffer, may be replaced with estimates of unclipped values thereof.

Said analogue to digital converter may produce a signal indicative of analogue to digital converter saturation, said clip processor may receive said signal, and said clip processor, on receipt of said signal, and for so long as said signal is present, may estimate values for clipped digital signal samples and cause said digitised samples to be replaced with estimates of unclipped values thereof.

Said clip processor may detect saturation of said analogue to digital converter by comparing a digitised sample produced by said analogue to digital converter to maximum and minimum values for said analogue to digital converter's dynamic range, and may estimate values for clipped digital signal samples and cause said digitised samples to be replaced with estimates of uncipped values thereof, on detection of saturation, and for so long as saturation is detected.

Said buffer may have a length sufficient to store:
  a first plurality of unclipped samples occurring before a group of clipped samples;
  said group of clipped samples; and
  a second plurality of unclipped samples following said group of clipped samples.

Said first and second plurality of samples may include identical numbers of samples.

Said first and second pluralities of samples may each comprise three samples.

Said clip processor may measure the number of samples in a consecutive group of clipped samples.

Said clip processor may estimate a value for each sample in said consecutive group of clipped samples from the number of samples in said group, the values of samples in a consecutive group of samples immediately preceding said consecutive group of clipped samples and the values of samples in a consecutive group of samples immediately following said consecutive group of clipped samples.

A digital signal may have a higher bit resolution after processing by said clip processor than it had prior to processing by said bit processor.

Said clip processor may estimate a value for each sample in said consecutive group of clipped samples from:
  the number of samples in said group;
  the values of samples in a consecutive group of samples immediately preceding said consecutive group of clipped samples;
  the values of samples in a consecutive group of samples immediately following said consecutive group of clipped samples;
  a normalised clip level, or crest factor, and
  an autocorrelation factor of a channel over which said analogue signal has as been transmitted.

Said clip processor may estimate a value for each sample in said consecutive group of clipped samples from:
  the number of samples in said group;
  the values of samples in a consecutive group of samples immediately preceding said consecutive group of clipped samples;
  the values of samples in a consecutive group of samples immediately following said consecutive group of clipped samples;
  a normalised clip level, or crest factor; and
  an autocorrelation factor of said analogue to digital converter.

Said first plurality of samples may include a single sample contiguous with said group of clipped samples and said second plurality of samples may include a single sample contiguous with said group of clipped samples.

Said clip processor may feed $n_{cut}$ (where $n_{cut}$ is the number of samples in a group of clipped samples), and coefficient vectors, $a_k$, sequentially, to a vector multiplier which performs one scalar product per clipped sample to be estimated, and by said scalar multiplier multiplying each sample, from a group of unclipped samples contiguous with a group of clipped samples, with a coefficient vector belonging to a sample to be estimated.

An output from said vector multiplier may be passed through a non-linearity to ensure that estimates of clipped samples stay above a clip level.

Embodiments of the invention will now be described, by way of example, with reference to the accompanying drawings, in which.

The clip processor of the present invention is a device for mitigating the effects of signal clipping by an analogue-to-digital converter.

Analogue to digital converters have a limited dynamic range for which they can produce an accurate digital representation. If the input signal exceeds the dynamic range, the digital representation no longer corresponds to the analogue input. However, the output of an ADC may include a signal indicating that the dynamic range has been exceeded, or, alternatively, it will be apparent from the form of the output signal, that the output signal has been clipped by the ADC. This phenomenon is usually referred to as "clipping" and is illustrated in FIG. 2 of the accompanying drawings. As can be seen from FIG. 2, the digitised version of a clipped analogue signal is a poor representation of that signal. The present invention, see FIG. 1, uses the knowledge that an analogue signal has been clipped to improve the digital representation of the analogue signal. As can be seen from FIG. 1, when an analogue signal is received by the ADC, which exceeds the dynamic range of the ADC, a saturation signal is generated, indicating that the digital output signal from the ADC is clipped. This saturation signal can be used to activate a clip processor, which regenerates the clipped portion of the digital signal, as described below. The output from the clip processor may be passed through a decimation filter, as shown in FIG. 1.

Figure 1:
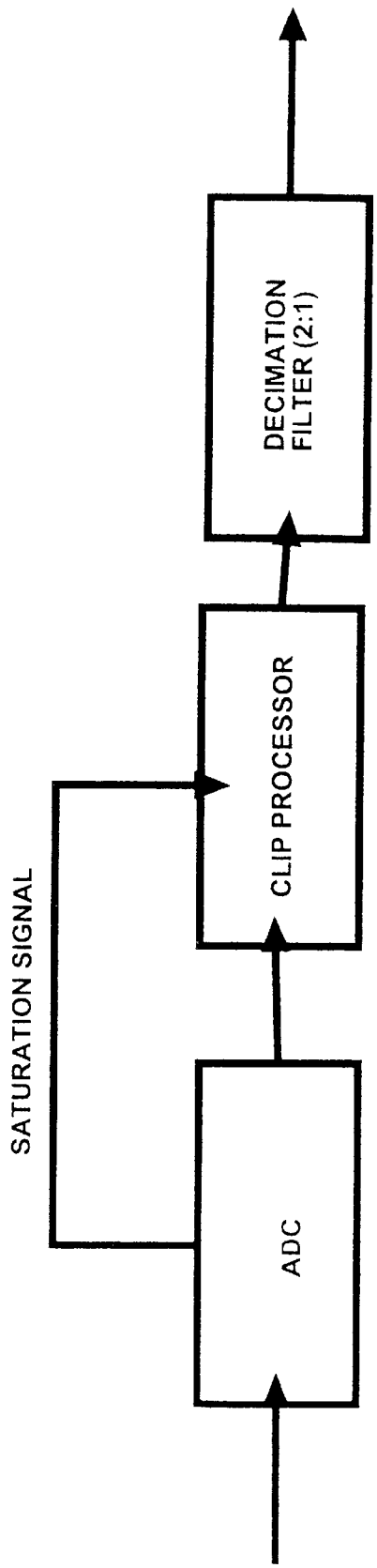
FIG. 1 illustrates, in block diagrammatic form, an analogue to digital conversion circuit according to the present invention.
Figure 2:
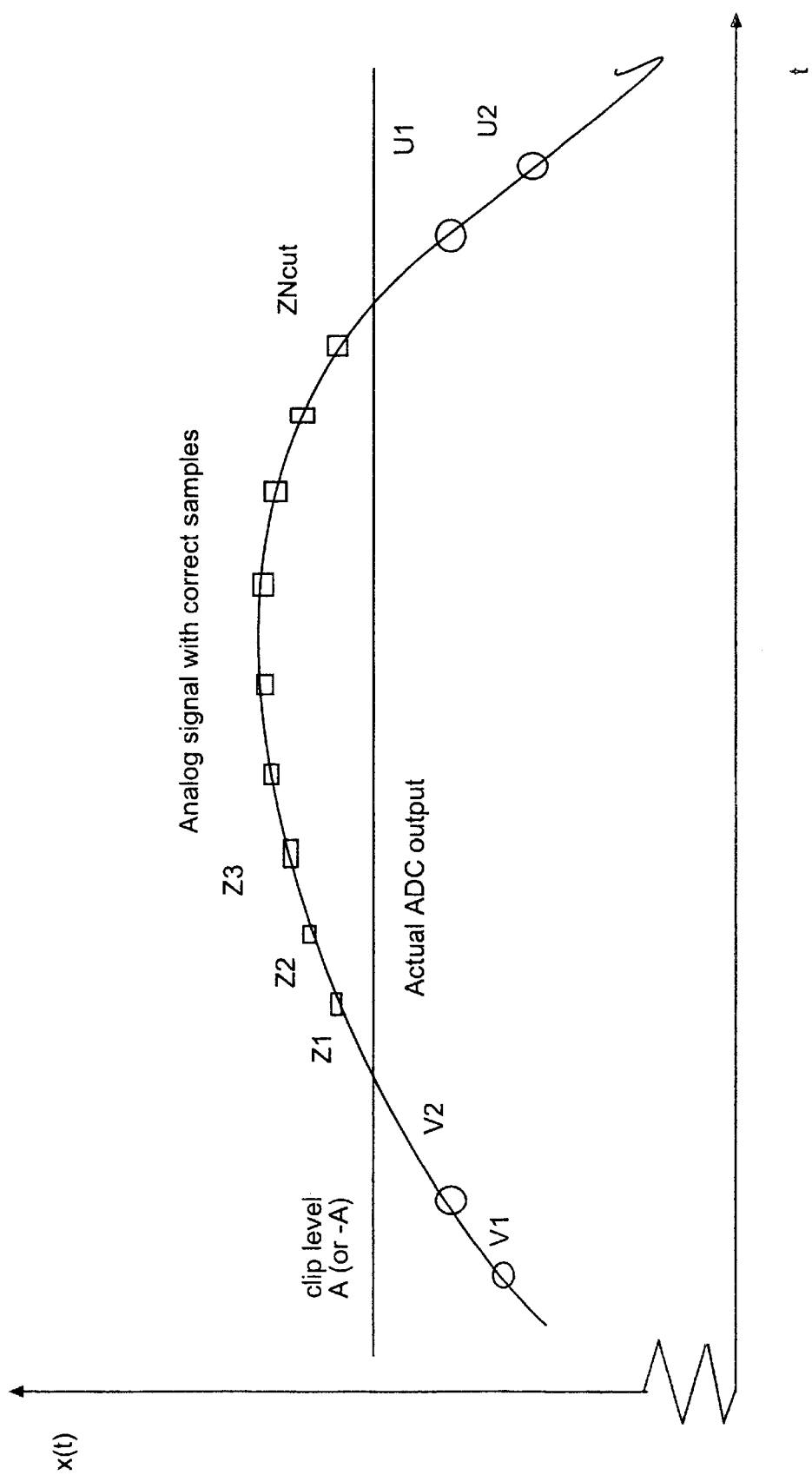
FIG. 2 illustrates the effect of clipping in an analogue to digital converter.

When a signal sample is clipped the ADC indicates this either through a dedicated "clipping" signal, for example the saturation signal of FIG. 1, or just by the fact that the output signal has attained the maximum, or minimum, value in the digital range produced by the ADC. When clipping occurs, it frequently happens that several consecutive samples of the analogue signal exceed the ADC's dynamic range. The clip processor of the present invention, tries to "fill in", or interpolate, the clipped samples, using the values of unclipped samples which precede and follow the clipped samples. The number of unclipped samples used in this interpolation procedure can vary. Typically, but not necessarily, the number of unclipped samples preceding the clipped group of samples, used in the interpolation process, is the same as the number of unclipped samples following the group of clipped samples, used in the interpolation process.

Figure 3:
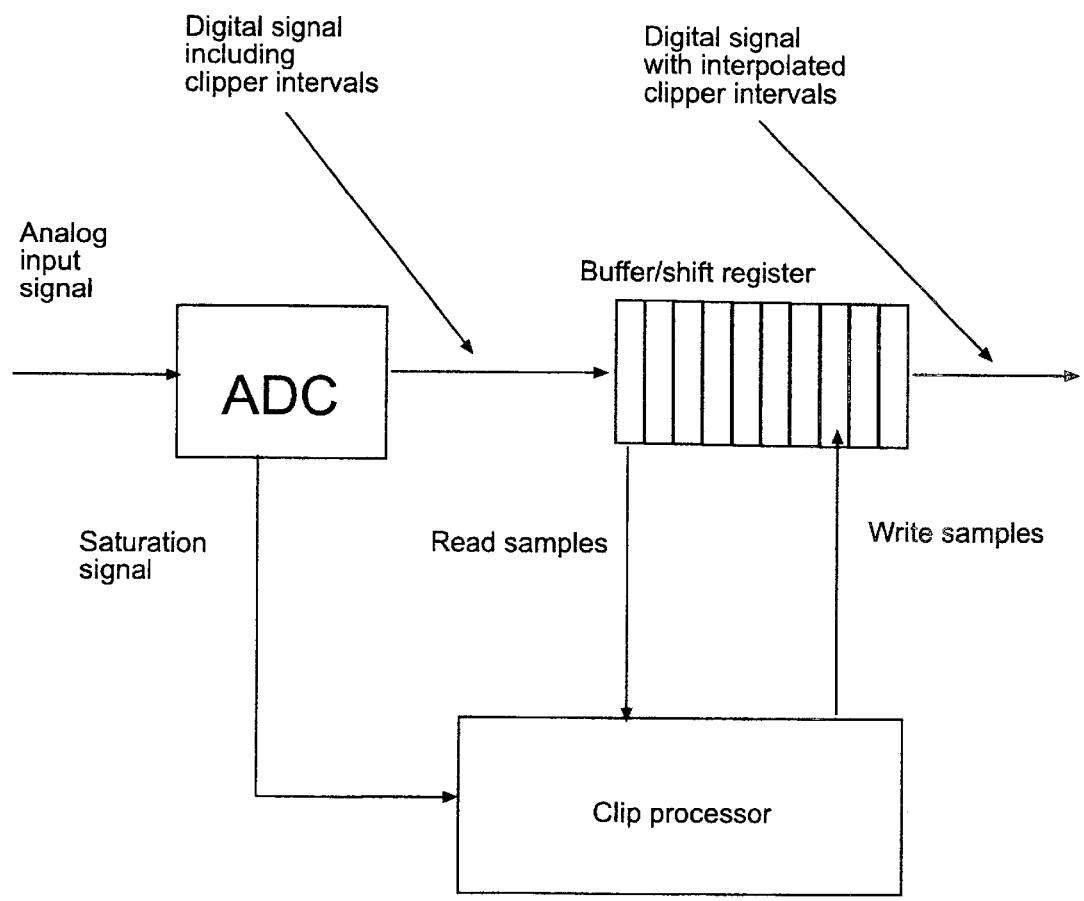
FIG. 3 illustrates a first embodiment of the present invention.

FIG. 3 illustrates a first embodiment of the present invention. An analogue signal is input to an analogue to digital converter, ADC. After digitisation, the digital output signal is passed to a buffer, or shift register, which provides dynamic storage of the signal. If the ADC saturates, i.e. the input analogue signal exceeds the dynamic range of the ADC, a saturation signal is passed to the clipper processor. The clipper processor is adapted to read the signal stored in the buffer, process the signal to at least partially correct for ADC saturation and rewrite the signal to the buffer. The presence of the saturation signal causes the clip processor to operate. The output from the buffer is a digital signal with interpolation of clipped sample values.

Figure 4:
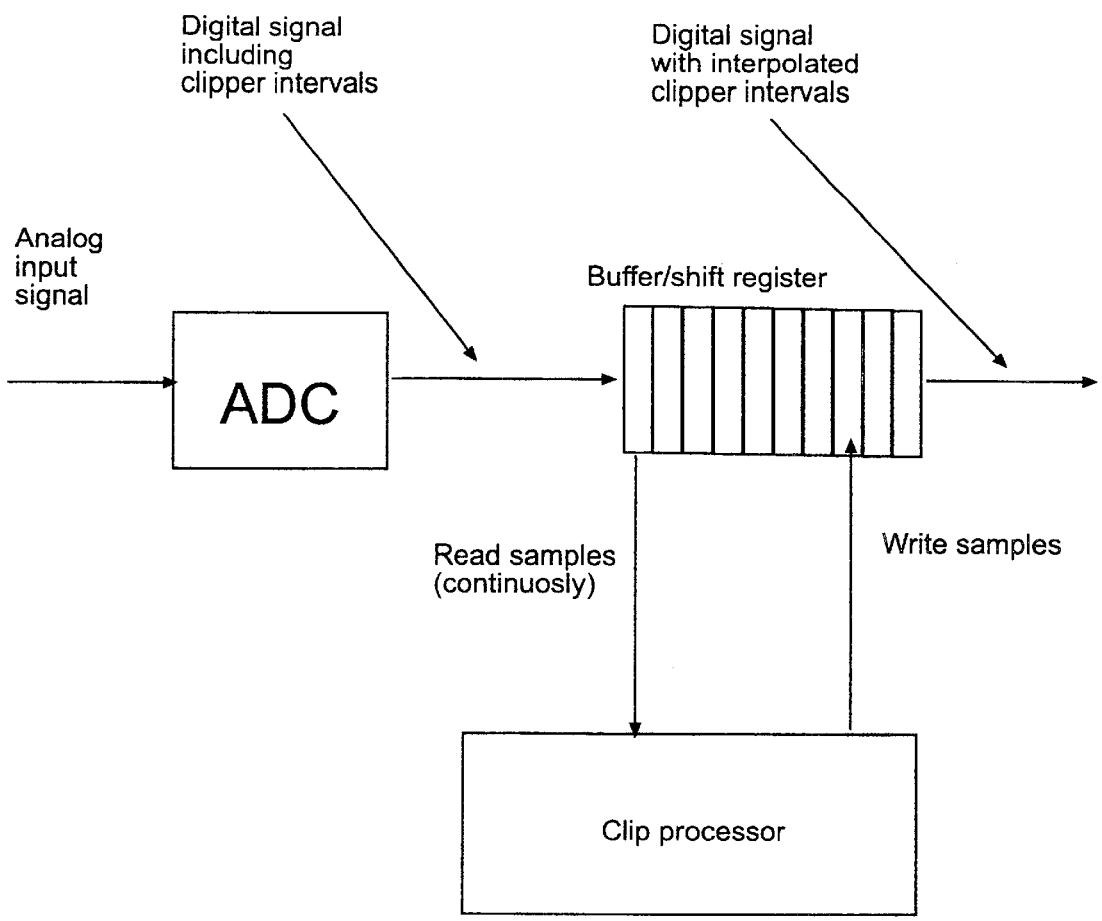
FIG. 4 illustrates a second embodiment of the present invention.

The embodiment of FIG. 3 uses an ADC, which produces a signal indicative of when the ADC is saturated. It is quite possible to implement the invention with an ADC that does not produce such a signal. A second embodiment of the present invention, in which the ADC does not produce a saturation signal, is shown in FIG. 4. Structurally, the circuit of FIG. 4 is the same as that of FIG. 3, except that the saturation signal is absent. In this embodiment the presence of clipping, caused by ADC saturation, is detected directly by the clip processor analysing the digitised signal dynamically stored in the buffer. The presence of saturation may, for example, be detected by identifying samples with values equal to the maximum dynamic range of the ADC. In all other respects, the embodiment of FIG. 4 operates in the same as that of FIG. 3.

As herein described, the clip processor is a device that mitigates the effects of signal clipping caused by saturation of the analogue to digital converter. Essentially, the clip processor calculates the correct value for the clipped part of the signal, from the values of the signal samples surrounding the clipped part based on statistical assumptions about the clipped samples' relationship to the surrounding samples.

Operation of the clip processor can be summarised by the following process steps:

1. The signal samples are buffered after analogue to digital conversion.
2. The clip processor detects clipping by, for example, monitoring the continuous digital signal after analogue to digital conversion for the highest or the lowest, possible values or by means of an indicator signal from the ADC itself.
3. The clip processor then determines the length of the group of clipped samples, i.e. the number of consecutive samples that have been clipped.
4. The samples immediately before the clipped interval and the samples immediately following the clipped interval are read from the buffer.
5. An estimate of the sample values for the clipped portion of the digital signal is computed. (The estimate is computed from the surrounding samples and from the length of the clipped interval.)
6. The estimation of the clipped portion of the signal is written back to the buffer, overwriting the clipped samples.
7. It should be noted that the bit resolution of the digital signal after processing by the clip processor is higher than the bit resolution of the digital signal immediately following analogue to digital conversion.

Figure 7:
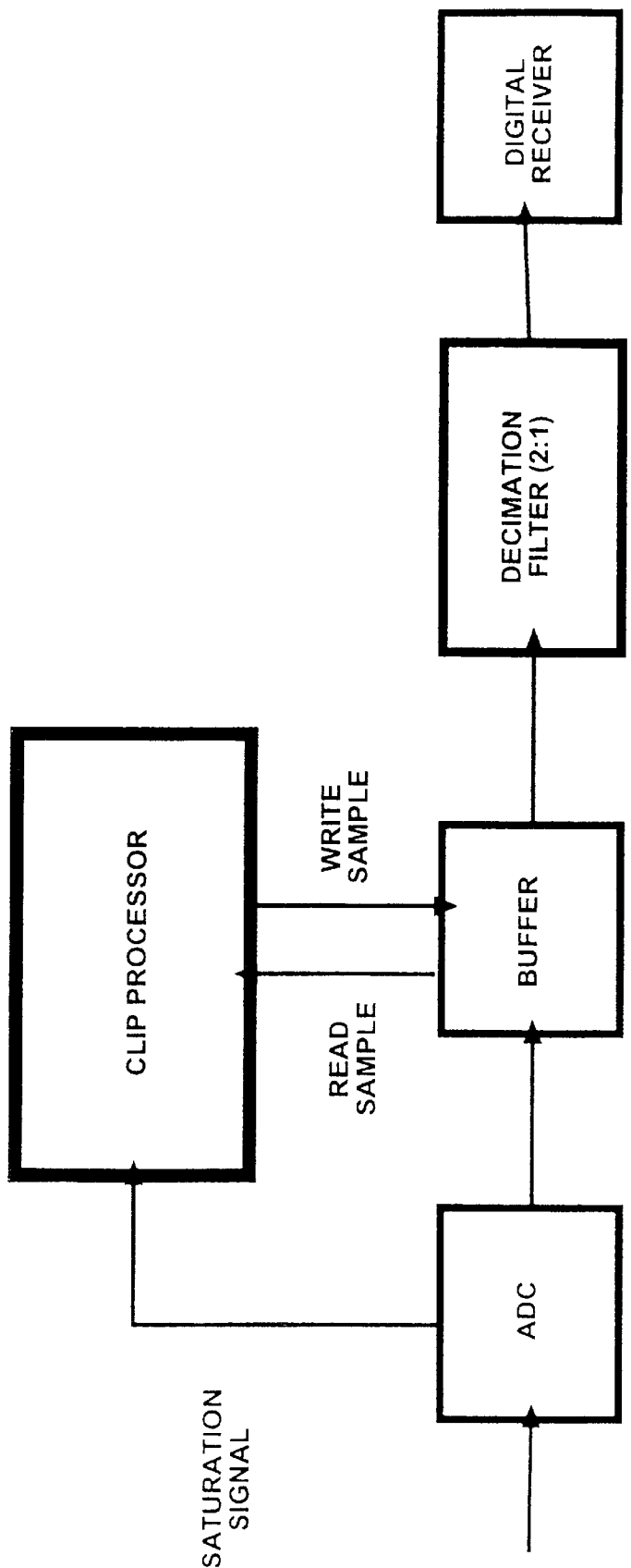
FIG. 7 illustrates the use of the clip processor of FIG. 6 in a digital receiver.

The clip processor itself is illustrated, in diagrammatic form, in FIG. 7. Detailed operation of the clip processor will be described later in this specification. However, it should be noted that the buffer, shown in FIGS. 3 and 4 could be incorporated within the clip processor.

The clip processor mitigates the effects of clipping by interpolating the signal in the clipped intervals. The clip processor also reduces the power of the clip noise. As previously stated, the digital precision of the digital signal is higher after processing by the clip processor than it is immediately after analogue to digital conversion.

The clip processor detects the clipping, which occurs when an analogue input signal exceeds the maximum positive value of an ADC, or when an analogue signal exceeds the maximum negative value of an ADC.

The sampled signal, after analogue to digital conversion is buffered in a memory, e.g. a shift register. The buffer is of sufficient length to allow the clip processor to read the samples before and after the clipped samples, to compute the estimate of the signal in the clipped interval, and to write the estimated signal back to the buffer. The clip processor computes the number of clipped consecutive samples and then estimates the true value of the clipped samples. This estimation is based on the value of the samples immediately preceding the clipped interval; the value of the samples immediately following the clipped interval and on the length of the clipped interval.

Many different algorithms can be used for the interpolation calculations used to estimate the true values of clipped samples. As an example, one such algorithm is discussed below.

In devising the exemplary algorithm, the important assumption, or choice of model is made, namely, it is assumed that the input signal to an analogue to digital converter is a stochastic process with a (coloured) Gaussian distribution. The theoretical description set out below has this stochastic approach as a foundation.

The performance of the clip processor, in terms of the effective SNR, can be evaluated by measuring, or estimating, the average power of errors caused by clipping. For the case where the input to the ADC is a stationary process, this power, averaged over many transmitted frames, can be written $$E\{(\hat{z}_k-z_k)^2||z_k|>\eta\} * \text{Prob}\{z_k|>\eta\}, \quad (1)$$

where, $\hat{z}_k$ is an estimate of the clipped $z_k$-value, and where the values $z_k$ should be interpreted as the unquantised values in the clipped interval. The estimate $\hat{z}_k$ is based on the information that $\{z_k|>\eta\}$ (where $\pm\eta$ are the clip levels), the width of the clipped peak, $n_{cut}$, as well as on the knowledge of the values of some unclipped samples, collected in a vector v. The estimates are sometimes denoted, $\hat{z}(n_{cut}, v, \eta)$, to indicate this dependency.

The vector v contains quantised values y and u on both sides of the clipped interval, $$v = \begin{pmatrix} y \\ u \end{pmatrix}, \quad (2)$$

where $$y = \begin{pmatrix} y_1 \\ y_2 \\ \vdots \\ y_{N_{left}} \end{pmatrix} \text{ and } u = \begin{pmatrix} u_1 \\ u_2 \\ \vdots \\ u_{N_{right}} \end{pmatrix} \quad (3)$$

collect the values on the right and the left side of the clipped interval, respectively. The estimates $\hat{z}_k$ within a clipped peak, are collected in the vector $$\hat{z} = \begin{pmatrix} \hat{z}_1 \\ \hat{z}_2 \\ \vdots \\ \hat{z}_{N_{cut}} \end{pmatrix}. \quad (4)$$

The average power of the clip-noise, over many frames, some clipped some unclipped, depends strongly on the probability that a z-value is clipped, i.e., the probability that $\{z_k|>\eta\}$, $$\text{Prob}\{z_k|>\eta\}=2*P(\eta), \quad (5)$$

where $$P(\eta) = \int_\eta^\infty p_z(z)dz \quad (6)$$

and $p_z(z)$ is the one-dimensional probability density for any $z_k$, with k not necessarily within a clipped peak.

Since the average clip-noise power is judged to be an essential measure of performance, a peak-estimator can be designed that minimises this power. As only the left factor of expression (1) can be affected by the choice of peak-estimator, this factor is rewritten as:

$$E\{(\hat{z}_k - z_k)^2||z_k|>\eta\} = E\left\{\frac{1}{N_{cut}}\sum_{k=1}^{N_{cut}} MSE(N_{cut}, V, \eta, k)\right\}, \quad (7)$$

where the expectation should be performed over the stochastics V and $N_{cut}$, and where $$MSE(n_{cut}, v, \eta, k)=E\{(\hat{z}_k-z_k)^2|n_{cut}, v, |z_k|>\eta\} \quad (8)$$

is the Mean Square Error (MSE) conditioned on the actual values v and $n_{cut}$ of the stochastics V and $N_{cut}$, respectively. This error can be rewritten as $$MSE(N_{cut}, V, \eta, k)=E\{z_k^2|n_{cut}, v, |z_k|>\eta\}-E^2\{z_k n_{cut}, v, |z_k|>\eta\}+[\hat{z}_k(n_{cut}, v, \eta)-E\{z_k|n_{cut}, v, |z_k|>\eta\}]^2 \quad (9)$$

and is minimised by the conditional mean $$\hat{z}_k(n_{cut}, v, \eta)=E\{z_k|n_{cut}, v, |z_k|>\eta\}. \quad (10)$$

With this choice the non-negative last term in (9) equals zero.

Now, to finalise the calculation of this optimal estimator (10), the joint probability density of the stochastic vector $(z_k, v^T)^T$ is needed. The estimator for the case that the corresponding unquantised values is zero-mean with a Gaussian distribution is calculated.

A Gaussian approximation of the density of the vector V is made, by viewing the quantising as an addition of uncorrelated, white Gaussian noise with the spectral density height $\Delta^2/12/f_s$, where $\Delta$ is the quantisation level and $f_s$, is the sampling rate. Then all probability properties are influenced only by 2:nd moments, i.e., the probability density for $(z_k, v^T)^T$ is influenced only by 2:nd moments, $$p_{z_k, v}(z_k, v) = \quad (11)$$

$$[(2\pi)^{N/2}|\begin{bmatrix}\sigma^2 & r_k^T \\ r_k & R\end{bmatrix}|^{1/2}]^{-1} \exp\left[-\frac{1}{2}\begin{pmatrix}z_k \\ v\end{pmatrix}^T \begin{bmatrix}\sigma^2 & r_k^T \\ r_k & R\end{bmatrix}^{-1}\begin{pmatrix}z_k \\ v\end{pmatrix}\right],$$

as well as the joint density function for V, $$p_v(v)=[(2\pi)^{1/2}|R|]^{-1} \exp[-\frac{1}{2}v^T R^{-1} v], \quad (12)$$

where R, $r_k$ and $\sigma^2$ are the 2:nd moments $$R=E\{v\cdot v^T\}, r_k=E\{v\cdot z_k\} \text{ and } \sigma^2=E\{z_k^2\}. \quad (13)$$

Based on the densities in (11) and (12), the conditional mean in (10) can be written as $$\hat{z}(n_{cut}, v, \eta) = \eta + s_k \cdot G\left(\frac{a_k^T v - \eta}{s_k}\right), \quad (14)$$

where ti $a_k = R^{-1} r_k$, +tm (15)

$$s_k^2 = \sigma^2 - r_k^T R^{-1} r_k, \quad (16)$$

$$G(x) = \phi(x)/Q(-x) + x, \quad (17)$$

and the function $\phi(x)$ is the Gaussian zero-mean, unit-variance probability density function $$\varphi(x) = \frac{1}{\sqrt{2\pi}} \cdot e^{\frac{x^2}{2}}, \quad (18)$$

and where the function $Q(x)$ is the probability that the corresponding stochastic variable is greater than x, $$Q(x) = \int_x^\infty \varphi(t) dt. \quad (19)$$

Figure 5:
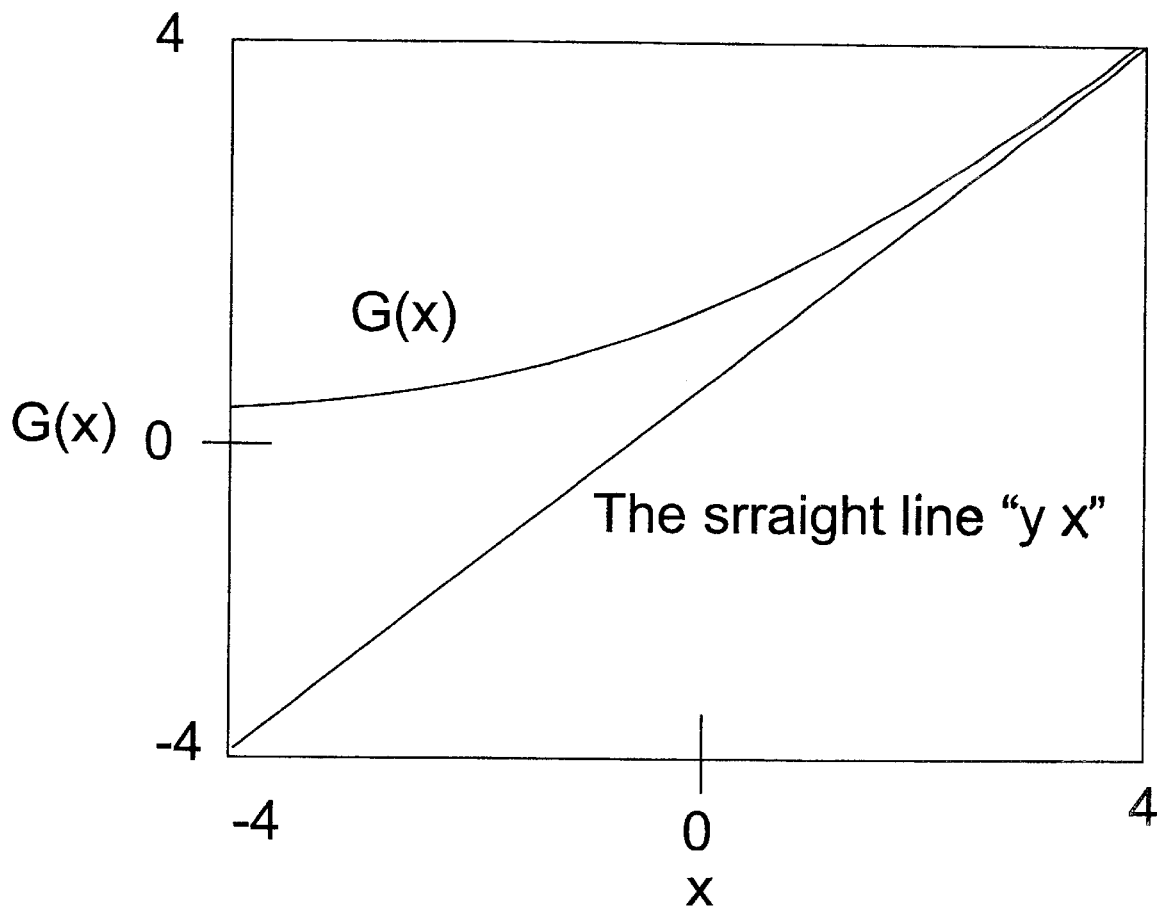
FIG. 5 illustrates a normalised version of n on-linearity of G(x), see equation 14 below.

The non-linearity $G(x)$ is shown as the upper curve in FIG. 5.

In equations (15) and (16) the solution to the following linear optimisation problem can be recognised: Find the $a_k$ that minimises $$E\{(a_k^T v - z_k)^2 | v\}. \quad (20)$$

This minimum is given by equation (15) and the residual error is given by equation (16). In FIG. 5 this corresponds to the straight line, i.e., for x<0, the estimate will be lower than the clip level.

In the evaluation of the performance, an essential measure is the frequency with which a frame contains a clipped peak. An estimate of the probability that a frame contains one clipped peak can be obtained by estimating the probability function for $N_{cut}$ Prob$\{N_{cut}=n\}$ and using this estimate to calculate the average number of clipped peaks $N_{peak}$ within a set of K frames. Within these $N_{peak}$ clipped peaks there will on average be $$\sum_n [(N_{peak} \cdot n) \cdot Prob\{N_{cut} = n\}] = N_{peak} \cdot \bar{n}_{cut} \quad (21)$$

samples where $$\bar{n}_{cut} = \sum_n [n \cdot Prob\{N_{cut} = n\}]. \quad (22)$$

But the average total number of samples within these $N_{peak}$ clipped peaks can also be calculated as $N_{ff} \cdot K \cdot 2 \cdot Q(\mu)$. Thus, the corresponding number of frames per clipped peak is $$\frac{K}{N_{peak}} = \frac{\bar{n}_{cut}}{N_{ff} \cdot 2 \cdot Q(\mu)} \quad (23)$$

and an estimate of the probability that there is a clipped peak within a frame, the inverse of this expression $$\frac{N_{peak}}{K} = \frac{N_{ff} \cdot 2 \cdot Q(\mu)}{\bar{n}_{cut}} \quad (24)$$

In "Probability, Random Variables and Stochastic Processes", A. Papoulis, pp345–348, Published McGraw-Hill 1984, "the level-crossing problem" is described. The expectation of the number of times a Gaussian process crosses a certain level is calculated. With the notations and definitions used herein, the expectation of the number of clipped peaks within a frame can be written $$\frac{N_{peak}}{K} = N_{ff} \cdot \lambda_\mu = N_{ff} \cdot \frac{1}{\pi} \sqrt{\frac{-akf''(0)}{akf(0)}} e^{\frac{\eta^2}{2 \cdot akf(0)}}, \quad (25)$$

where akf($\tau$) is the autocorrelation function for the input to the ADC. This expression can be rewritten as $$\frac{N_{peak}}{K} = N_{ff} \cdot 2 \cdot B_{channel} \cdot e^{-\mu^2/2}, \quad (26)$$

where $B_{channel}$ is the single-sided bandwidth of the spectral density of the input signal to the ADC. It is defined as $$B_{channel} = \sqrt{\frac{\int_{-\infty}^{\infty} f^2 R_{channel}(f) df}{\int_{-\infty}^{\infty} R_{channel}(f) df}}, \quad (27)$$

with $R_{channel}(f)$ equal to the spectral density for the input signal to the ADC. Using equations (26) and (27) in equation (23), we have the expectation of the width of a clip $$\bar{n}_{cut} = \frac{Q(\mu) e^{\mu^2/2}}{B_{channel}} \left( \approx \frac{1}{B_{channel} \mu \sqrt{2\pi}} \right). \quad (28)$$

An implementation of the clip processor, viewing it as a part of the ADC, is depicted in FIG. 7.

The inputs to the clip processor used for computing an estimate of the clipped samples z are:

the samples y and u on both sides of the clipped interval the normalised clip level $\mu$ (crest factor)

a saturation indicator signal from the ADC the number of consecutively clipped samples, $n_{cut}$, which can be derived from the saturation signal the autocorrelation function of the channel, or preferably, the autocorrelation function of the ADC input signal.

Depending on the choice of algorithm, a version of the clip processor which only needs to operate on samples contiguous with the sides of the clip and the saturation signal can be constructed. However, such a clip processor will have a somewhat poorer performance than a clip processor operating on several samples located both before and after the clip.

Figure 6:
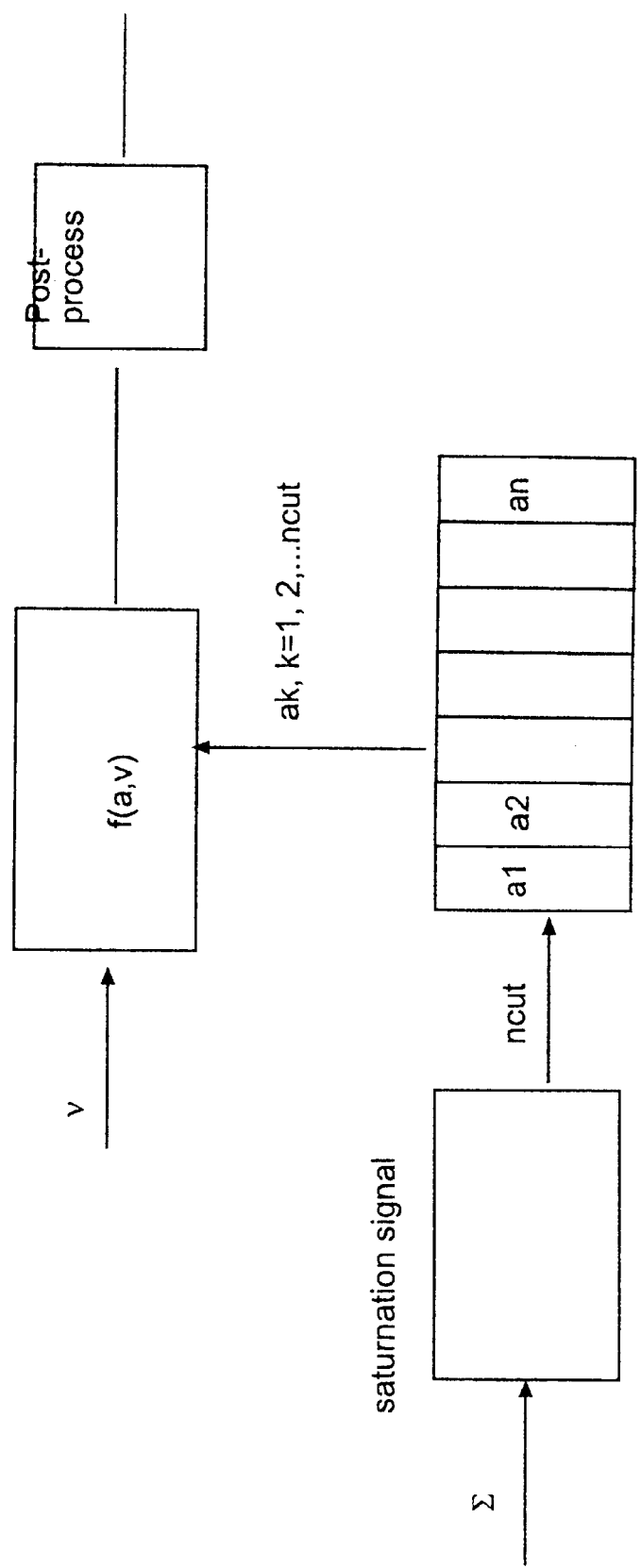
FIG. 6 illustrates the structure of a clip processor, according to the present invention.

As can be seen from FIG. 6, the clip processor consists of four components. A saturation signal derived from the ADC indicates which samples are clipped and, implicitly, how many clipped samples are in the sequence, $n_{cut}$. The number of clipped samples, $n_{cut}$, identifies a set of $n_{cut}$ coefficient vectors $a_k$. The vectors $a_k$ have the same number of coefficients as the number of samples used in the interpolation of the clipped samples. The vectors are dependent on the channel correlation. However, a correlation can be assumed and these vectors can be pre-calculated and stored in a ROM. In one embodiment of the present invention, 3 samples are used on each side of the clip. In this case, the $a_k$ vectors would be one-by-six.

The $n_{cut}$ coefficient vectors $a_k$ are fed sequentially to a vector multiplier that performs one scalar product per clipped sample to be estimated. For each sample it multiplies the (six) samples on the side of the clip with the coefficient vector belonging to the sample to be estimated.

The output from the vector multiplier is then passed through a non-linearity post-processor ensuring that the estimates stay above the clip-level. A normalised version of the non-linearity is shown in FIG. 5, cf. equations (14) and (17).

The present invention can, with advantage, be employed in the Zipper-VDSL system developed by Telia AB. This system may become a standard. However, the present invention has application to all ADCs. The present invention can be used as a component in many high performance systems, or even as a component in a large number of consumer electronics products.

It is believed that the present invention represents an entirely novel approach to increasing the dynamic range of a receiver which must be convert a received line signal into digital form for subsequent processing. Such a receiver is illustrated in FIG. 7. The Zipper VDSL proposal requires ADCs with a higher dynamic range than currently available ADCs. The present invention enables these high dynamic ranges to be achieved.

What is claimed is:

1. A circuit, comprising:
   an analogue to digital converter for digitising an analogue signal to form digitised samples;
   a clip processor, adapted to determine estimated values for clipped digitised samples; and
   means for replacing said clipped digitised samples with said estimated values, thereby mitigating effects of clipping in an output from said circuit;
   wherein said means for replacing includes a buffer adapted to dynamically store a plurality of said digitised samples produced by said analogue to digital converter;
   wherein said clip processor is adapted to read said digitised samples from said buffer and replace said clipped digitised samples with said estimated values;
   wherein said buffer is of a length sufficient to store a first plurality of unclipped digitised samples occurring before a group of said clipped digitised samples, said group of said clipped digitised samples, and a second plurality of unclipped digitised samples following said group of said clipped digitised samples; and
   wherein said first and second pluralities of unclipped digitised samples each comprise at least three samples.

2. The circuit, as claimed in claim 1, wherein:
   said analogue to digital converter is adapted to produce a signal indicative of analogue to digital converter saturation; and
   said clip processor is adapted to receive said signal and, on receipt of said signal and for so long as said signal is present, to determine said estimated values for said clipped digitised samples and to cause said means for replacing to replace said clipped digitised samples with said estimated values.

3. The circuit, as claimed in claim 1, wherein said clip processor is adapted to detect saturation of said analogue to digital converter by comparing a digitised sample produced by said analogue to digital converter to maximum and minimum values for a dynamic range of said analogue to digital converter.

4. The circuit, as claimed in claim 1, wherein said means for replacing is incorporated within said clip processor.

5. The circuit, as claimed in claim 1, wherein said buffer is a shift register.

6. The circuit, as claimed in claim 1, wherein said clip processor is adapted to measure a number of consecutive samples in a first group of said clipped digitised samples.

7. A circuit, comprising:
   an analogue to digital converter for digitising an analogue signal to form digitised samples;
   a clip processor, adapted to determine estimated values for clipped digitised samples; and
   means for replacing said clipped digitised samples with said estimated values, thereby mitigating effects of clipping in an output from said circuit;
   wherein said clip processor is adapted to measure a number of consecutive samples in a first group of said clipped digitised samples; and
   wherein said clip processor is adapted to determine an estimated value for each sample in said first group from the number of consecutive samples in said first group, values of consecutive digitised samples in a second group of digitised samples immediately preceding said first group, and values of consecutive digitised samples in a third group of digitised samples following said first group.

8. The circuit, as claimed in claim 7, wherein said clip processor includes a vector multiplier to process a number $n_{cut}$ of consecutive samples in said first group, and coefficient vectors $a_k$, the vector multiplier performing one scalar product for each clipped digitised sample to be estimated; and
   said vector multiplier is adapted to multiply each sample from a group of unclipped samples contiguous with the first group with a coefficient vector belonging to a sample to be estimated.

9. The circuit, as claimed in claim 8, further comprising a non-linearity post processor, wherein an output from said vector multiplier is passed through the non-linearity post-processor to ensure that estimates of clipped digitised samples stay above a clip level.

10. A circuit, comprising:
    an analogue to digital converter for digitising an analogue signal to form digitised samples;
    a clip processor, adapted to determine estimated values for clipped digitised samples; and
    means for replacing said clipped digitised samples with said estimated values, thereby mitigating effects of clipping in an output from said circuit;
    wherein a digital signal output from said circuit has a higher bit resolution after processing by said clip processor than it had prior to processing by said clip processor,
    wherein said clip processor is adapted to measure a number of consecutive samples in a first group of said clipped digitised samples and is further adapted to determine an estimated value for each sample in said first group from:
    the number of consecutive samples in said first group;
    values of consecutive samples in a second group of samples immediately preceding said first group; and
    values of consecutive samples in a third group of samples immediately following said first group.

11. The circuit, as claimed in claim 10, wherein said clip processor is further adapted to determine the estimated value for each sample in said first group from a normalised clip level or crest factor, and an autocorrelation factor of said analogue to digital converter.

12. A digital receiver, wherein said digital receiver includes the circuit, as claimed in any of claims 2–5, 1–7, 10–9, for digitising a received analogue signal.

13. A DMT transmission system, wherein said DMT transmission system includes a plurality of digital receivers as claimed in claim 12.

14. A method of digitising an analogue signal, comprising acts of:
   sampling, quantising, and digitising the analogue signal to form samples of a digitised signal;
   buffering said samples of said digitised signal;
   detecting whether said samples are clipped;
   determining a number of consecutive clipped samples, constituting a group of clipped samples;
   reading a first plurality of unclipped samples preceding said group of clipped samples into a buffer, reading said group of clipped samples into said buffer and reading a second plurality of unclipped samples into said buffer;
   determining estimated values of the consecutive clipped samples of said group of clipped samples; and
   overwriting said group of clipped samples in said buffer with the estimated values.

15. A method of analogue to digital conversion, comprising acts of:
   determining estimated values for clipped digitised samples;
   replacing said clipped digitised samples with said estimated values, thereby mitigating effects of clipping;
   dynamically storing a plurality of digitised samples, produced by an analogue to digital converter, in a buffer;
   reading digitised samples from said buffer into a clip processor; and
   determining if any of the digitised samples is a clipped digitised sample;
   wherein said buffer has a length sufficient to store:
      a first plurality of unclipped digitised samples occurring before a group of said clipped digitised samples;
      said group of said clipped digitised samples; and
      a second plurality of unclipped digitised samples following said group of said clipped digitised samples, and wherein the method further comprises an act of dynamically storing the first plurality of unclipped digitised samples, the group of said clipped digitised samples, and the second plurality of unclipped digitised samples in the buffer.

16. The method, as claimed in claim 15, further comprising acts of:
   producing a signal indicative of analogue to digital converter saturation; and
   for so long as said signal is present, determining the estimated values for the clipped digitised samples and replacing said clipped digitised samples with the estimated values.

17. The method as claimed in claim 16, further comprising acts of:
   detecting saturation of said analogue to digital converter by comparing a digitised sample produced by said analogue to digital converter to maximum and minimum values for a dynamic range of said analogue to digital converter;
   determining the estimated values for said clipped digitised samples; and
   causing said clipped digitised samples to be replaced with the estimated values, on detection of the saturation, and for so long as the saturation is detected.

18. The method, as claimed in claim 15, wherein said first and second pluralities of unclipped digitised samples include identical numbers of samples.

19. The method, as claimed in claim 18, wherein said first and second pluralities of unclipped digitised samples each comprise at least three samples.

20. The method, as claimed in claim 18, wherein said first plurality of unclipped digitised samples includes a single sample contiguous with said group of said clipped digitised samples and said second plurality of unclipped digitised samples includes a single sample contiguous with said group of said clipped digitised samples.

21. The method, as claimed in claim 15, wherein the method further comprises an act of measuring a number of samples in a first group of consecutive clipped digitised samples.

22. A method of analogue to digital conversion, comprising acts of:
   determining estimated values for clipped digitised samples;
   replacing said clipped digitised samples with said estimated values, thereby mitigating effects of clipping;
   dynamically storing a plurality of digitised samples, produced by an analogue to digital converter, in a buffer;
   reading digitised samples from said buffer into a clip processor;
   determining if any of the digitised samples is a clipped digitised sample;
   measuring a number of samples in a first group of consecutive clipped digitised samples; and
   determining an estimated value for each sample in said first group from the number of consecutive samples in said first group, values of consecutive digitised samples in a second group of digitised samples immediately preceding said first group, and values of consecutive digitised samples in a third group of digitised samples immediately following said first group.

23. A method of analogue to digital conversion, comprising acts of:
   determining estimated values for clipped digitised samples;
   replacing said clipped digitised samples with said estimated values, thereby mitigating effects of clipping;
   dynamically storing a plurality of digitised samples, produced by an analogue to digital converter, in a buffer;
   reading digitised samples from said buffer into a clip processor;
   determining if any of the digitised samples is a clipped digitised sample;
   inputting to said clip processor a first digital signal comprising said clipped digitised samples; and
   outputting from said clip processor a second digital signal comprising said estimated values;
   wherein said second digital signal has a higher bit resolution than said first digital signal.

24. A method of analogue to digital conversion, comprising acts of:
   determining estimated values for clipped digitised samples;

replacing said clipped digitised samples with said estimated values, thereby mitigating effects of clipping;

dynamically storing a plurality of digitised samples, produced by an analogue to digital converter, in a buffer;

reading digitised samples from said buffer into a clip processor;

determining if any of the digitised samples is a clipped digitised sample;

inputting to said clip processor a first digital signal comprising said clipped digitised samples;

outputting from said clip processor a second digital signal comprising said estimated values, wherein said second digital signal has a higher bit resolution than said first digital signal; and measuring a number of samples in a first group of consecutive clipped digitised samples and determining an estimated value for each sample in said first group from:

the number of consecutive samples in said first group;

values of consecutive samples in a second group of samples immediately preceding said first group; and values of samples in a third group of samples immediately following said first group.

25. The method, as claimed in claim 24, wherein the method further comprises an act of determining an estimated value for each sample in said first group from a normalised clip level or crest factor, and an autocorrelation factor of said analogue to digital converter.

26. The method, as claimed in claim 25, wherein the method further comprises acts of:

processing $n_{cut}$ consecutive samples in said first group, and coefficient vectors $a_k$, sequentially, in a vector multiplier to perform one scalar product for each clipped digitised sample to be estimated by multiplying each sample from a group of unclipped samples contiguous with the first group with a coefficient vector belonging to a sample to be estimated.

27. The method, as claimed in claim 26, further comprising an act of passing an output from said vector multiplier through a non-linearity post-processor to ensure that estimates of clipped digitised samples stay above a clip level.

28. A circuit, comprising:

an analog to digital converter for digitizing an analog signal;

a clip processor adapted to determine estimated values for clipped digital signal samples; and means for replacing said clipped digital signal samples with said estimated values, said means for replacing including a buffer adapted to dynamically store a plurality of digitized samples produced by said analog to digital converter, wherein:

said clip processor is adapted to read the digitized samples from said buffer and replace said clipped digital signal samples, in the buffer, with the estimated values; and said clip processor is adapted to process at least some digitized samples following said clipped digital signal samples to determine the estimated values.

\* \* \* \* \*